United States Patent [19]

Fang et al.

[11] 4,398,992
[45] Aug. 16, 1983

[54] DEFECT FREE ZERO OXIDE ENCROACHMENT PROCESS FOR SEMICONDUCTOR FABRICATION

[75] Inventors: Robert C. Y. Fang, Newark; Kuang Y. Chiu, Palo Alto, both of Calif.

[73] Assignee: Hewlett-Packard Company, Palo Alto, Calif.

[21] Appl. No.: 380,195

[22] Filed: May 20, 1982

[51] Int. Cl.³ .................. H01L 21/306; B44C 1/22; C03C 15/00; C03C 25/06

[52] U.S. Cl. ............................. 156/643; 29/571; 29/580; 156/646; 156/649; 156/653; 156/657; 156/659.1; 156/662; 204/192 E; 357/56; 427/94; 427/95

[58] Field of Search ............... 156/649, 651, 653, 657, 156/659.1, 662, 643, 646; 29/571, 580; 430/313, 314, 316, 317; 204/192 E, 192 EC; 357/41, 53, 56; 427/93–95

[56] References Cited

U.S. PATENT DOCUMENTS

| | | | |
|---|---|---|---|
| 3,958,040 | 5/1976 | Webb | 427/93 X |
| 4,333,964 | 6/1982 | Ghezzo | 427/93 |
| 4,356,056 | 10/1982 | Cornette et al. | 156/659.1 X |
| 4,361,600 | 11/1982 | Brown | 427/93 |

*Primary Examiner*—William A. Powell
*Attorney, Agent, or Firm*—Jeffery B. Fromm; Ronald E. Grubman

[57] ABSTRACT

A method for local oxideation of a semiconductor using only conventional large scale integration (LSI) fabrication techniques is provided which results in an oxide layer without the formation of the so-called "bird's beak" structure and no process or structure induced defects. On a semiconductor substrate a mold for oxide is made by forming on the substrate, a trench with sidewalls extending upward to a localized mesa region of the substrate. The sidewalls of the mesa, the localized plateau and a distance out from the sidewalls of the mesa to a desired distance out from the sidewalls are covered by a masking layer capable of preventing oxideation of the underlying substrate. The unmasked portion of the mold is oxidized to produce a localized oxide layer which is substantially free of any "bird's beak" structure.

8 Claims, 21 Drawing Figures

DEFECT FREE ZERO OXIDE ENCROACHMENT PROCESS FOR SEMICONDUCTOR FABRICATION

BACKGROUND

Electrical insulating layers are typically required in both discrete semiconductor devices and in integrated circuits. This invention is concerned with a process for producing a local insulating layer by the oxidation of a semiconductor material.

The local oxidation of silicon (LOCOS) has been widely used for large scale integrated (LSI) circuits because it presents several advantages such as surface planarity, improvement in packing density and compatibility with standard LSI processing. However, the conventional LOCOS process used to produce a silicon dioxide insulating layer results in the formation of a so-called "bird's beak" shaped structure on the borders of the silicon dioxide. This phenomena reduces the width of non-insulated channels which are located between areas where the oxidation of silicon has occurred. This reduction in channel width is a major obstacle to the manufacturing of very large scale integrated (VLSI) circuits when devices are scaled down to the micrometer and submicrometer range. Thus, the fabrication of the bird's beak free device has been an essential objective for many future process and scaled device technologies.

Several prior art methods are known which purport to achieve the growing of thick oxide with small or even zero bird's beak structures, as shown in Isaac, "Fabrication Process for Full Box Isolation Without a Bird's Beak" *IBM Technical Disclosure Bulletin*, Vol. 22, No. 11 (April 1980) pp. 5148-51, Matsumoto, et at., "Method of Manufacturing Semiconductor Devices," U.S. Pat. No. 4,292,156 (Sept. 29, 1981) and Sun, et al., "Local Oxidation of a Semiconductor," U.S. Patent application Ser. No. 276,395 (filed June 6, 1981), now abandoned, but it has been observed that these methods are vulnerable to defect generation, particularly edge dislocations around the mesas or islands. These defects are directly related to and induced by the structures used in each method.

SUMMARY

This disclosure demonstrates a new isolation technique which permits the growth of thick field oxide with zero bird's beak structure and no process or structure induced defects. The process is compatible with the standard very large scale integration (VLSI) fabricating process with no additional masking steps involved. The final structures are flat surfaces across the mesas isolated with relatively thick field oxide down to 1 micrometer/1 micrometer width/space or less.

In accordance with the preferred embodiments of the present invention, a method is provided for oxidizing a semiconductor surface without producing a "bird's beak" structure and without introducing extra defects as compared to the LOCOS process. On a semiconductor substrate a mold for oxide is made by forming on the substrate, a trench with sidewalls extending upward to a localized mesa region of the substrate. The sidewalls of the mesa, the localized plateau, and a distance out from the sidewalls of the mesa are covered by a series of masking layers capable of preventing oxidation of the underlying substrate.

A layer of low pressure chemically vapor deposited (LPCVD) silicon dioxide ($SiO_2$) is used above a second silicon nitride layer ($Si_3N_4$) as a mask for nitride etching around the mesa edges. After anisotropic plasma etching of the oxide and nitride, the second nitride film covers the mesa edges and extends into the field region to a width equal to the LPCVD oxide thickness. The unmasked portion of the mold is oxidized to produce a "bird's beak" free localized oxide layer.

In carrying out this method, only conventional LSI fabrication techniques are used. Using this structure, the stress resulting from oxidation is similar to that of the conventional local oxidation process. The new isolation technique permits the growing of thick field oxide with no process or structure induced defects, particularly due to edge dislocations around the mesas. In addition, the disclosed structure relaxes the requirement of vertical sidewalls on the mesa and also permits the use of a thin second nitride film, as well as the over-etching of the nitride film. The result is that more reproducible processes can be achieved and a more reliable device and circuit can be made as compared with earlier processes.

DETAILED DESCRIPTION OF THE INVENTION

Figure 1A:
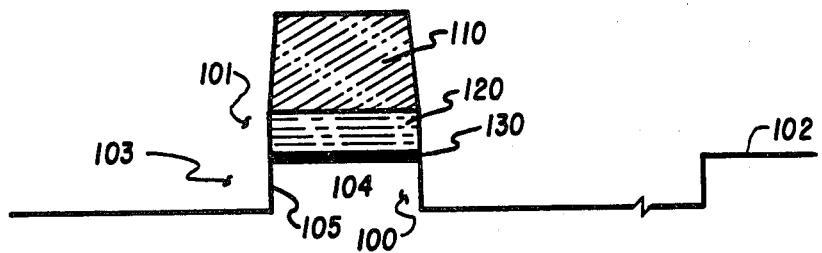
FIG. 1A-L illustrates a first embodiment of a bird's beak free local oxidation process in accordance with the disclosed method.

FIG. 1 illustrates a first embodiment of the present invention. Referring to FIG. 1A, on a silicon substrate 100 a padding layer 130 is formed, typically consisting of stress relief oxide (SRO) thermally grown at 1000 C. in a dry ambient followed by nitrogen annealing for 20 minutes. A masking layer 120, e.g., a silicon nitride ($Si_3N_4$) film low pressure chemically vapor deposited (LPCVD) at 800 C. in a 4:1 volume ratio of $NH_3:SiH_2Cl_2$, is formed over the first SRO layer 130. Typically the thickness of the first SRO layer 130 is about 300-400 angstroms and the first layer 120 is about 1000-1500 angstroms. A positive photoresist layer 110 on top of the first nitride layer 120 as shown. The first nitride 120 and first SRO 130 layers are removed over a region 101 of substrate 100 for example by a flurocarbon plasma etch, such as $C_2F_6$ in a helium atmosphere. A trench 103 is then formed in substrate 100, leaving first nitride 120, first SRO 130, and photoresist 110 layers on a mesa 104 above the trench 103 with no overhang. Trench 103 may be etched out of the substrate 100 below the original surface 102 using an anisotropic plasma etch of $CCl_4$ with 10% helium. The sidewalls 105 of mesa 104 are shown to be vertical although in actual practice the sidewalls may be slightly sloped. Typically trench 103 is etched to a depth of about 0.2 micrometers. For NMOS processing, a boron channel stop can be implanted after the trench 103 has been etched.

Figure 1B:
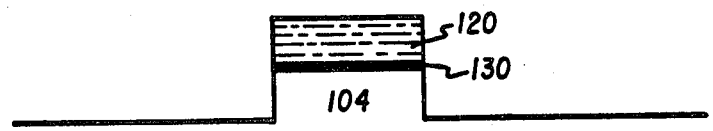

FIG. 1B shows mesa 104 overlain by the first nitride 120 and first SRO 130 layers after the photoresist mask 110 is removed in preparation for further masking.

Figure 1C:
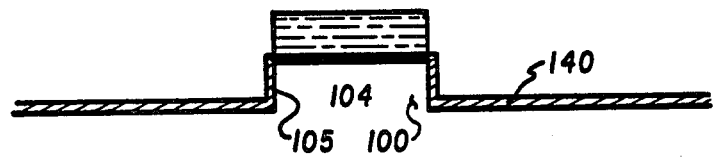

FIG. 1C shows the growth of a second SRO layer 140 over the exposed surface of substrate 110 and the sidewalls 105 of mesa 104. Typically, the second SRO layer 140 is 250-350 angstroms thick.

Figure 1D:
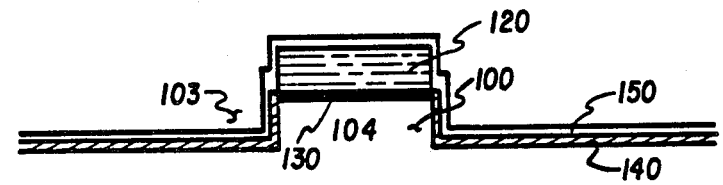

FIG. 1D shows the deposition of a second nitride mask 150 over the entire surface of the substrate 100 covering the first nitride layer 120, the first SRO padding layer 130, the second SRO padding layer 140, and thus the mesa 104 and the trench 103. This second nitride layer 150 is typically about 250 angstroms thick. It should be noted that in practice the first SRO 130 and second SRO 140 layers as well as the first nitride 120 and second nitride 150 layers respectively, although shown as separate entities for clarity, do not remain separate but merge together since they are chemically of the same materials.

Figure 1E:
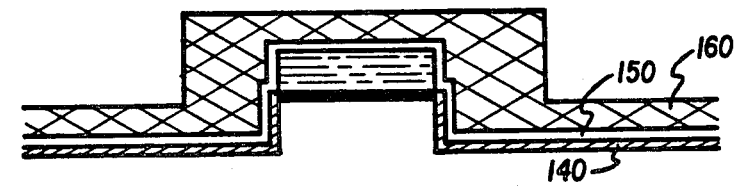

FIG. 1E shows the deposition of a spacing layer 160 which is formed typically of low pressure chemically vapor deposited oxide (LPCVD $SiO_2$). The LPCVD oxide 160 is preferably deposited at 925 C. in a 2:1 volume ratio of $N_2O:SiH_2Cl_2$ and is typically 2000 angstroms thick.

Figure 1F:
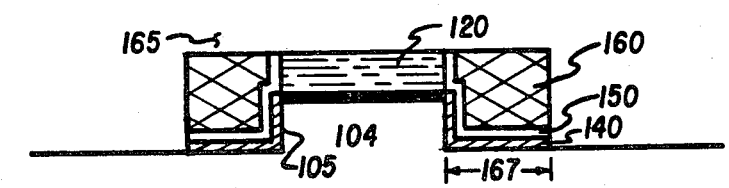

Referring now to FIG. 1F, the LPCVD oxide 160, second nitride 150, and second SRO 140 layers are anisotropically plasma etched. A strongly unidirectional plasma etch, such as $C_2F_6$ with 25% helium can be used to accomplish this step. The second SRO layer 140 and the second nitride layer 150 now extend into the field region 165 to a width 167 substantially equal to the thickness of the LPCVD oxide 160. Actually, the length of extension 167 into the field region 165 is slightly more than the thickness of the LPCVD oxide 160 due to the thickness of the second SRO layer 140 and the second nitride layer 150, but typically the thickness of the LPCVD oxide 160 dominates. Thus, by adding a thick layer of LPCVD oxide 160 to the underlying second nitride 150 and second SRO 140 layers, it is possible to anisotropically etch the structure while the second nitride 150 and second SRO 140 layers remain for a substantial distance 167 out from the sidewalls 105 of mesa 104. Hence, as further processing is done on the structure, no forces are exerted on the mesa 104 itself. It should also be noted that by over-etching the LPCVD oxide 160, second nitride 150, and second SRO 140 layers the width of the extension 167 into the trench region 165 can be decreased; or by adding additional masking layers the extension 167 into the trench region 165 can be increased.

Figure 1G:
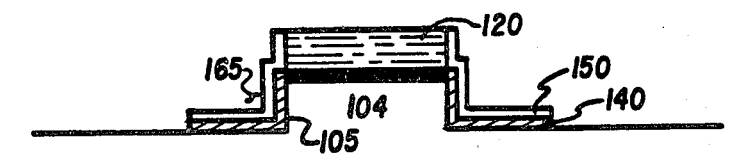

THe LPCVD oxide 160 can now be removed as shown in FIG. 1G for example, by wet etching in a 5:4:1 volume ratio of $NH_4F:H_2O:HF$.

Figure 1H:
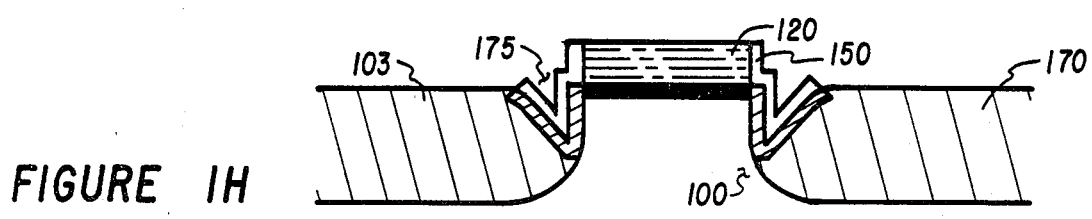
Figure 1I:
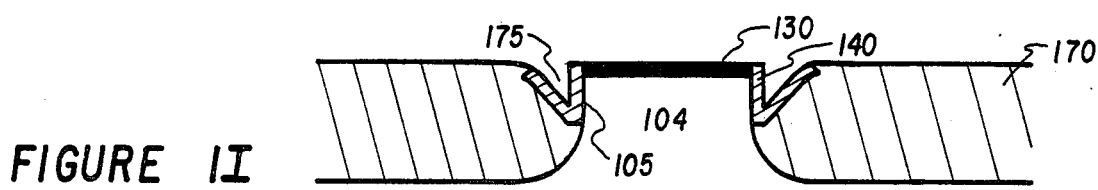
Figure 1J:
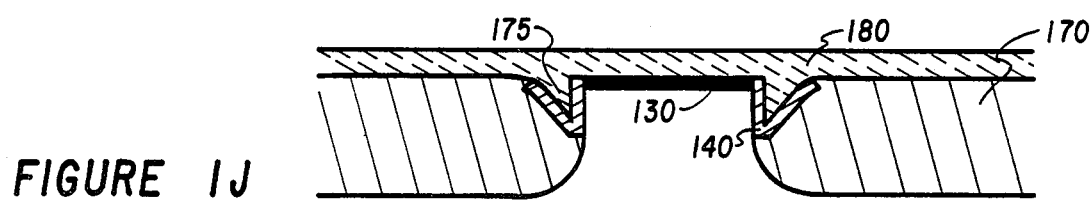
Figure 1K:
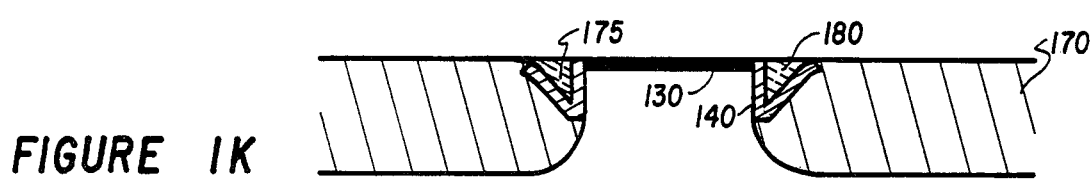
Figure 1L:
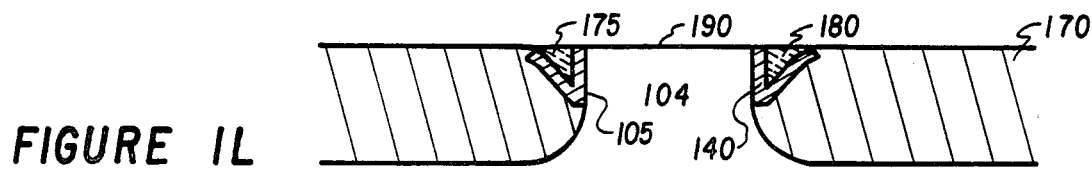
Figure 2A:
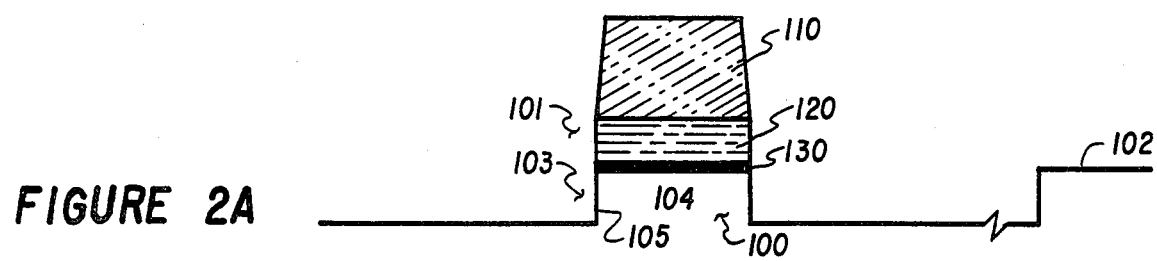
FIG. 2A-I illustrates a second embodiment of the disclosed method.
Figure 2B:
Figure 2C:
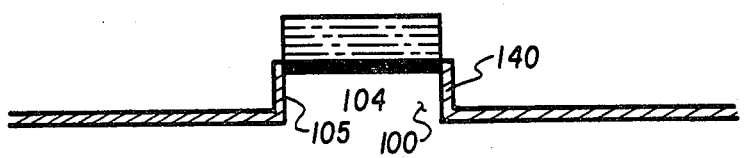
Figure 2D:
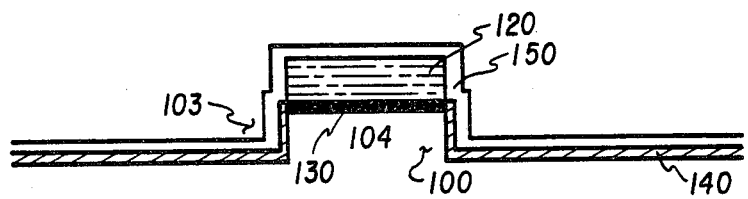
Figure 2E:
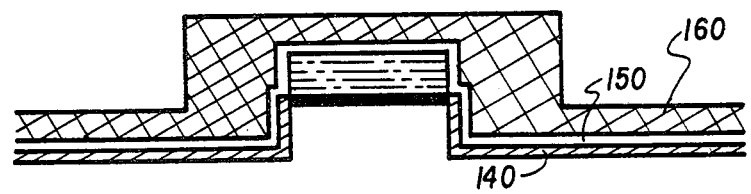
Figure 2F:
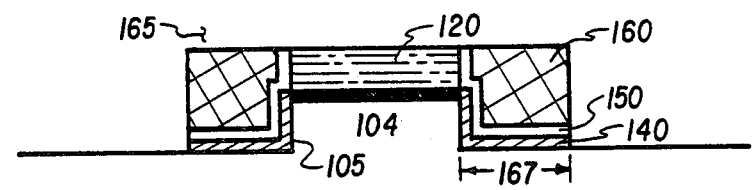
Figure 2G:
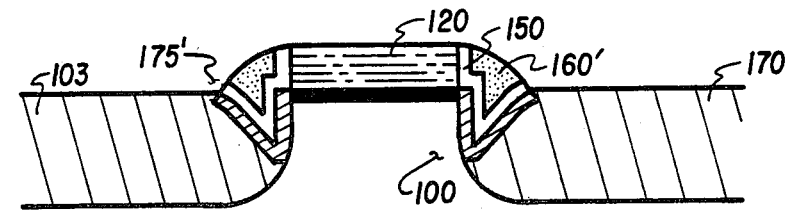
Figure 2H:
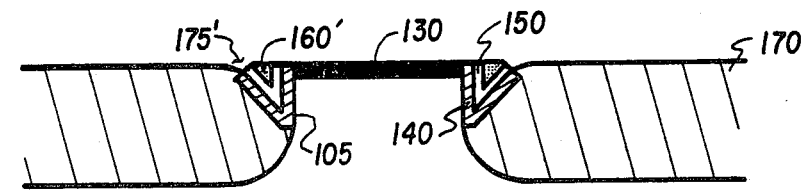
Figure 2I:
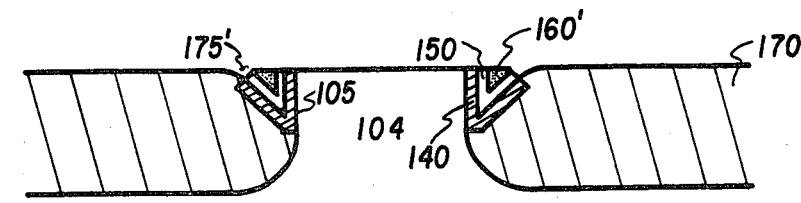

FIG. 1H shows the growth of a field oxidation 170 in the trench 103. For a silicon substrate 100 the oxide ($SiO_2$) may be grown at 900 C. in a wet steam environment. Nitride layers 120 and 150 can now be removed as shown in FIG. 1I. Boiling in phosphoric acid for 80 minutes is sufficient to remove masks consisting of silicon nitride. Typically there is a gap 175 in the oxide 170 where the second nitride mask 150 is removed from the sidewalls 105 of mesa 104. This gap 175 can be filled as shown in FIG. 1J by depositing LPCVD oxide 180 at 925 C. using a 2:1 volume ratio of $N_2O:SiH_2Cl_2$. The LPCVD oxide 180 can then be etched back by plasma etching as shown in FIG. 1K by using $C_2F_6$ with 25% helium. The plasma etch will also remove the SRO layers 130 and 140. It is helpful however to remove the last 300–400 angstroms of the SRO layers 130 and 140, and the LPCVD oxide 180 by wet etching in a 5:4:1 volume ratio of $NH_4F:H_2O:HF$ as shown in FIG. 1L to prevent the possible contamination of the top surface 19 of mesa 104 by the $C_2F_6$ plasma.

Thus, a bird's beak free structure is produced with no process or structure induced defects since the novel addition of the relatively thick layer of LPCVD oxide 160 prevents stress from being applied along the sidewalls 105 of mesa 104 at any time during fabrication.

FIG. 2 shows another embodiment of the present invention. The steps A through F in FIG. 2 are identical to steps A through F in FIG. 1. However, in this second embodiment the LPCVD oxide 160 is left on the sidewalls 105 during the application of field oxide 170 as shown in FIG. 2G. The LPCVD oxide 160 now assumes a new shape 160' as shown in FIG. 2G and serves to help fill the oxide gap 175'. Thus it is no longer necessary to apply LPCVD oxide 180 as in FIG. 1J. The plasma etch of FIG. 2H and the wet etch of FIG. 2I are also suited for the removal of LPCVD oxide 160' as done in FIGS. 1K and 1L respectively. A small oxide gap 175' may remain but it is sufficiently small and distant from the sidewalls 105 of mesa 104 so as not to require filling.

We claim:

1. A method for producing a semiconductor structure comprising the steps of:
    removing a portion of a semiconductor substrate to form a mesa-like shape with a flat top in the same plane as said substrate, said mesa being surrounded by a trench region in said substrate;
    forming multiple layers of covering materials over said mesa and said trench;
    removing said layers of covering materials so that a coating of said materials remains over the top and sides of said mesa, and extending into said trench region at least to a width substantially equal to the total thickness of said multiple layers;
    oxidizing the exposed surface of said substrate to form an oxide thereon; and
    removing the remainder of said covering materials and oxide, to expose the top surface of said mesa to form an essentially flat surface of oxide and covering materials in the same plane as the top of said mesa.

2. A method for producing a semiconductor structure comprising the steps of:
    forming a first layer of material on the surface of a semiconductor substrate;
    forming a second layer of material over said first layer;
    selectively covering a region of said underlying substrate with a mask;
    removing said first and second layers not covered by said mask;
    removing a portion of said substrate not covered by said mask to form a mesa-like shape with a flat top in the same plane as said substrate, said mesa being surrounded by a trench region in said substrate;
    removing said mask;
    forming a third layer of material on the surface of said substrate not covered by said second layer;
    forming a fourth layer of material over said first, second and third layers;
    forming a fifth layer of material over said fourth layer;
    removing all of said fifth, fourth, and third layers which are essentially parallel to said substrate so that a coating of layers remains over the top and sides of said mesa, and extending into said trench region at least to a width substantially equal to the total thickness of said third, fourth, and fifth layers;

removing the remainder of said fifth layer;
forming a sixth layer of material on said substrate;
removing the remainder of said second and fourth layers;
forming a seventh layer of material over said first, third, and sixth layer to create a surface which is essentially flat and parallel to said substrate; and
removing portions of said seventh, sixth, third, and first layers exposing the upper surface of said mesa and creating a flat surface in the same plane as said upper surface of said mesa.

3. A method for producing a semiconductor structure comprising the steps of:
forming a first layer of material on the surface of a semiconductor substrate;
forming a second layer of material over said first layer;
selectively covering a region of said underlying substrate with a mask;
removing said first and second layers not covered by said mask;
removing a portion of said substrate not covered by said mask to form a mesa-like shape with a flat top in the same plane as said substrate, said mesa being surrounded by a trench region in said substrate;
removing said mask;
forming a third layer of material on the surface of said substrate not covered by said second layer;
forming a fourth layer of material over said first, second and third layers;
forming a fifth layer of material over said fourth layer;
removing all of said fifth, fourth, and third layers which are essentially parallel to said substrate so that a coating of layers remains over the top and sides of said mesa, and extending into said trench region at least to a width substantially equal to the total thickness of said third, fourth, and fifth layers;
forming a sixth layer of material on said substrate; and
removing portions of said sixth, fifth, fourth, third, and first layers exposing the upper surface of said mesa and creating an essentially flat surface in the same plane as said top of said mesa.

4. A method as in claims 1, 2 or 3 wherein said semiconductor substrate is silicon.

5. A method as in claims 2 or 3 wherein said first type material is silicon dioxide, $SiO_2$.

6. A method as in claims 2 or 3 wherein said second type material is silicon nitride, $Si_3N_4$.

7. A method as in claim 2 wherein the step of removing portions of said seventh, sixth, third, and first layers further comprises the steps of:
plasma etching said layers to within 300–500 angstroms of the top of said mesa; and
wet etching the remaining 300–500 angstroms of said layers to expose the upper surface of said mesa creating a flat surface in the same plane as the top of said mesa.

8. A method as in claim 3 wherein the step of removing portions of said sixth, fifth, fourth, third, and first layers further comprises the steps of:
plasma etching said layers to within 300–500 angstroms of the top of said mesa; and
wet etching the remaining 300–500 angstroms of said layers to expose the upper surface of said mesa creating a flat surface in the same plane as the top of said mesa.

* * * * *

UNITED STATES PATENT AND TRADEMARK OFFICE
CERTIFICATE OF CORRECTION

PATENT NO. : 4,398,992
DATED : August 16, 1983
INVENTOR(S) : ROBERT C. Y. FANG and KUANG Y. CHIU It is certified that error appears in the above—identified patent and that said Letters Patent is hereby corrected as shown below:

Column 2, line 44, "first layer 120" should read --first nitride layer 120--;

Column 2, line 66, "110" should read --100--;

Column 3, line 46, "THe" should read --The--;

Column 3, line 67, "19" should read --190--.

Signed and Sealed this

Eleventh Day of September 1984

[SEAL]

Attest:

GERALD J. MOSSINGHOFF

Attesting Officer

Commissioner of Patents and Trademarks